US008146025B2

(12) United States Patent  
Yang et al.

(10) Patent No.: US 8,146,025 B2  
(45) Date of Patent: Mar. 27, 2012

(54) METHOD FOR CORRECTING LAYOUT PATTERN USING RULE CHECKING RECTANGLE

(75) Inventors: Yu-Shiang Yang, Tainan County (TW); Chun-Hsien Huang, Tainan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 292 days.

(21) Appl. No.: 12/512,034

(22) Filed: Jul. 30, 2009

(65) Prior Publication Data

US 2011/0029939 A1   Feb. 3, 2011

(51) Int. Cl.  
*G06F 17/50* (2006.01)

(52) U.S. Cl. .............................. 716/52; 716/54; 716/112

(58) Field of Classification Search .................... 716/52, 716/54, 112  
See application file for complete search history.

(56) References Cited

U.S. PATENT DOCUMENTS

| | | | |
|---|---|---|---|
| 5,062,054 A * | 10/1991 | Kawakami et al. ........... 716/112 |
| 6,128,767 A | 10/2000 | Chapman | |
| 6,687,885 B2 | 2/2004 | Ono | |
| 6,832,360 B2 * | 12/2004 | Li .................................. 716/112 |
| 7,700,247 B2 * | 4/2010 | Ausschnitt ....................... 430/30 |
| 7,742,162 B2 * | 6/2010 | Tsutsui et al. ............. 356/237.4 |
| 2004/0008879 A1 * | 1/2004 | Lin .............................. 382/144 |
| 2007/0207393 A1 * | 9/2007 | Ikenaga ............................ 430/5 |

* cited by examiner

*Primary Examiner* — Naum Levin  
(74) *Attorney, Agent, or Firm* — Winston Hsu; Scott Margo

(57) ABSTRACT

A method for correcting layout pattern is disclosed. The method includes the steps of: providing a layout pattern having at least one segment; forming a rule-checking rectangle from the segment, wherein the rule-checking rectangle comprises at least one square; verifying whether the square of the rule-checking rectangle overlaps other layout pattern; removing the portion of other layout pattern overlapped by the square to obtain a corrected layout pattern; and outputting the corrected layout pattern to a mask.

5 Claims, 3 Drawing Sheets

METHOD FOR CORRECTING LAYOUT PATTERN USING RULE CHECKING RECTANGLE

BACKGROUND OF THE INVENTION

1. Field of the Invention

The invention relates to a method of correcting layout pattern, and more particularly, to a method of correcting layout pattern with no blind spot.

2. Description of the Prior Art

Critical technologies such as the photolithography and etching technologies are frequently used in semiconductor manufacturing processes. The photolithography technology usually involves transferring a complicated integrated circuit pattern to a semiconductor wafer surface for steps such as etching and implantation. These patterns must be extremely accurate for forming delicate integrated circuits so as to align with the patterns of the previous and following steps.

In the photolithographic step, deviations often occur and jeopardize the performance of the semiconductor device when the patterns on the masks are transferred onto the wafer surface. Such deviations are usually related with the characters of the patterns to be transferred, the topology of the wafer, the source of the light and various process parameters.

There are many known verification methods, correction methods and compensation methods for the deviations caused by the optical proximity effect, process rules (PRC) and lithography rules (LRC) to improve the image quality after transfer. Some of the known methods are called optical proximity correction (OPC), process rule check (PRC) and lithography rule check (LRC). The commercially available OPC software may test problems such as pitch, bridge, and critical dimension uniformity in the layout patterns. Such software may correct the standard layout patterns on the masks using the theoretical image, so as to obtain correctly exposed image patterns on the wafers. Such methods not only test problems in the layout patterns but also correct the layout patterns on the masks using the theoretical image. If the corrected image patterns are useable, they are output for the fabrication of masks to obtain the correct image patterns on the wafer.

Generally speaking, there are well-established stand operational procedures available for the reference of the above-mentioned verification, correction and compensation methods. For example, the conventional procedure using optical proximity correction to verify the layout patterns on a mask may be first inputting a layout pattern. Then the Boolean pre-treatment of OPC is performed on the layout pattern to obtain a preliminary layout pattern. An OPC is conducted thereafter by using a variety of commercial optical proximity correction software, which can correct the mask pattern theoretically to acquire more correct pattern on a wafer.

A mask pattern corrected by the optical proximity correction must be inspected by a process rule check (PRC) to confirm the correctness of the mask pattern. If the corrected mask pattern completely obeys the rules of the process rule check, the mask pattern is then output and provided to a mask for lithography process. Conversely, if a portion or all portions of the mask pattern violates the rules of process rule check, the mask pattern needs to be re-modified and verified. The process rule check (PRC) inspects line ends and corners of each segment of a mask pattern to verify that if those geometrical patterns obey the limitation of the critical width and the critical space of the designed integrated circuit layout.

However, the aforementioned inspection typically inspects a target pattern from a 45 degree approach, such as from 0-45 degree, 45-90 degree, 90-135 degree, or 135-180 degree. The 45 degree based inspection often creates a blind spot between every 45 degree angle and limits the correction process from outputting a precise layout pattern.

SUMMARY OF THE INVENTION

It is an objective of the present invention to provide a method for correcting layout pattern for reducing blind spot issue caused by conventional 45 degree inspection approach.

According to a preferred embodiment of the present invention, a method for correcting layout pattern is disclosed. The method includes the steps of: providing a layout pattern having at least one segment; forming a rule-checking rectangle from the segment, wherein the rule-checking rectangle comprises at least one square; verifying whether the square of the rule-checking rectangle overlaps other layout pattern; removing the portion of other layout pattern overlapped by the square to obtain a corrected layout pattern; and outputting the corrected layout pattern to a mask.

According to another aspect of the present invention, a method for correcting layout pattern is disclosed. The method includes the steps of: providing a layout pattern having at least one segment; forming a rule-checking rectangle from the segment, wherein the rule-checking rectangle comprises at least one square; verifying the region exceeded by the square while overlapping the layout pattern with the square; reinstating the region exceeded by the square to obtain a corrected layout pattern; and outputting the corrected layout pattern to a mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
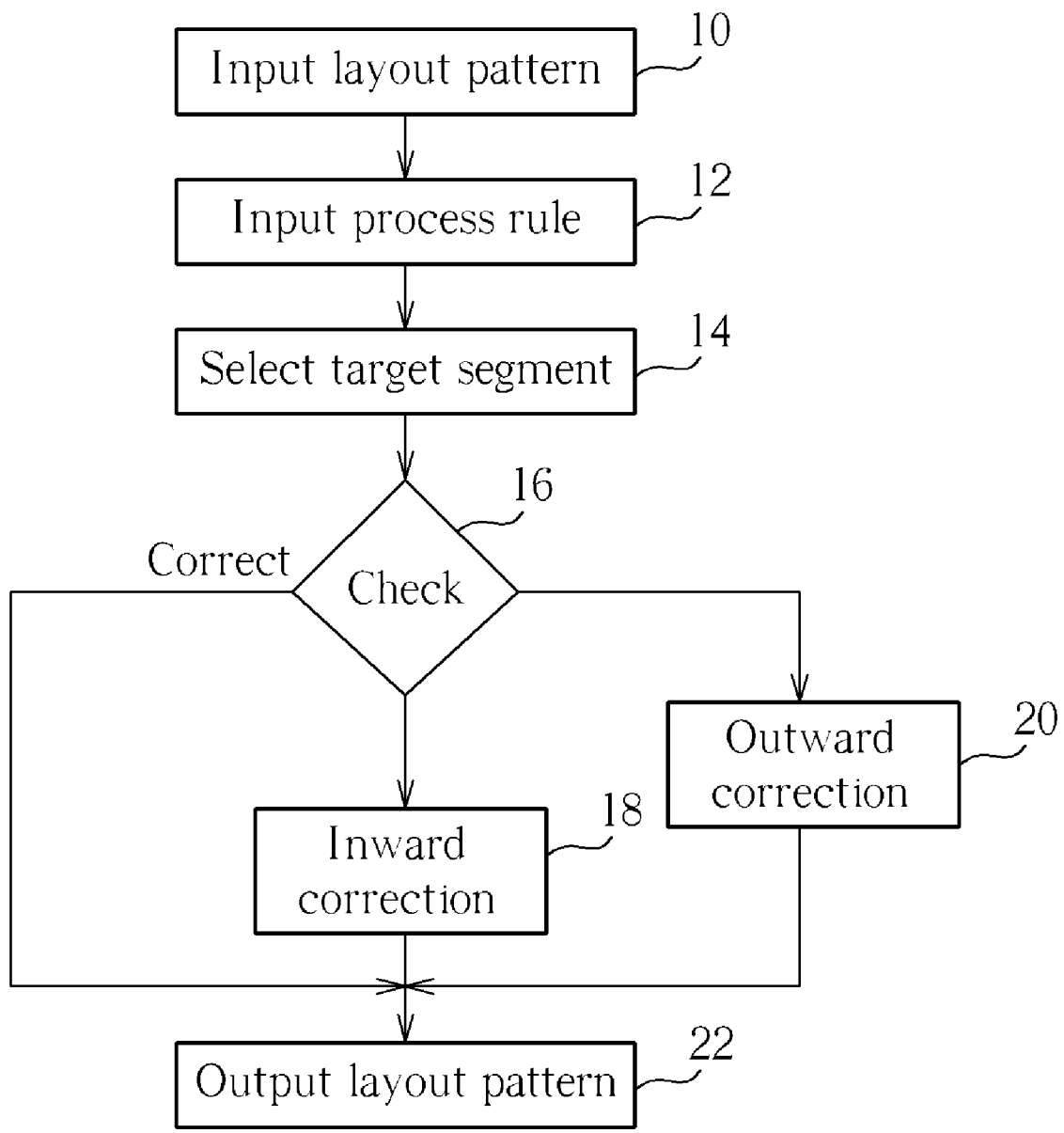
FIG. 1 is a flow chart illustrating a method of correcting a layout pattern of the present invention.

Referring to FIG. 1, FIG. 1 is a flow chart illustrating a method of correcting a layout pattern of the present invention. The method of verifying a layout pattern includes following steps. First, step 10 is carried out to input a preliminary layout pattern from a computer system, in which the layout pattern includes at least a segment. The layout pattern has preferably been corrected at least once by an optical proximity correction in the aforementioned computer system or other computer systems. The optical proximity corrections are prevalent correction methods used to modify widths, line ends and corners of each segment of a layout pattern in semiconductor industry. Next, step 12 is carried out to input a process rule. The process rule includes the critical width and the critical space or other design rules, which may derivate from the integrated circuits of the line width of 65 nm, 45 nm or below. Afterwards, step 14 is carried out to select a target segment and expand a rule-checking rectangle from the target segment, and a verification is conducted through the rule-checking rectangle, as shown by step 16. If the verification is complete, such as the process rule is satisfied, step 22 is carried out to output a verified layout pattern from the computer system. The verified layout pattern is preferably used to fabricate a mask utilized in a lithography process later on. However, if the verification fails, the computer system would provide a correcting value to perform an inward correction of step 18 or an outward correction of step 20 from the segment. Finally, step 22 is carried out to output the corrected layout patterns for fabricating desirable masks.

Figure 2:
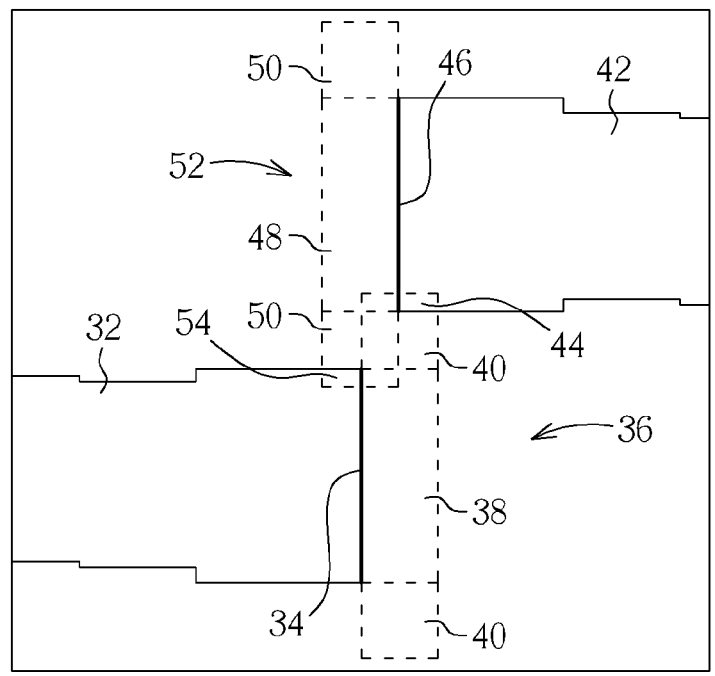
FIG. 2 illustrates a method for performing an outward correction according to a preferred embodiment of the present invention.

Referring to FIG. 2, FIG. 2 illustrates a method for performing an outward correction according to a preferred embodiment of the present invention. As shown in FIG. 2, a preliminary layout patter 32, such as a pattern being processed through optical proximity process and Boolean process is provided. For sake of brevity, only a portion of the layout pattern 32 is shown in the figure. The aforementioned optical proximity correction is a common technique widely used in today's industries, which preferably corrects the width of each segment, end of the straight line, and various corners of a layout pattern. The layout pattern 32 of this embodiment is preferably a mask pattern utilized for fabricating trenches, contact vias, or polysilicon gates of a semiconductor device, and the layout pattern 32 could be a clear tone or a dark tone region according to the demand of the process.

A segment 34 is then selected from the layout pattern 32, and a rule-checking rectangle 36 containing at least one square is expanded outward from the segment 34. In this embodiment, the segment 34 is preferably the end portion of the layout pattern 32 adjacent to other layout pattern, and the rule-checking rectangle 36 is preferably composed of a rectangle 38 and two squares 40 formed at two ends of the rectangle 38. The length of the rectangle 38 is preferably equivalent to the length of the segment 34, and the width of the rectangle 38 and one sides of the square 40 is assigned as a minimum space according to a mask rule check (MRC) specification.

Next, each square 40 and rectangle 38 within the rule-checking rectangle 36 is verified to be whether overlapping other adjacent layout pattern. In this embodiment, the square 40 on top is determined to be overlapping a portion of an adjacent layout pattern 42. As the overlapping region exceeds the minimum space defined by the mask rule check specification, this overlapping region is assigned as a minimum space violation region 44. In order to satisfy the space specification defined, the minimum space violation region 44 generated during outward correction must be removed before forming a desirable layout pattern. After removing this minimum space violation region 44, a corrected layout pattern 42 is obtained.

Similar to the outward correction of the layout pattern 32, another outward correction could be conducted from the layout pattern 42. As shown in FIG. 2, a segment 46 is selected from the layout pattern 42, and a rule-checking rectangle 52 containing a rectangle 48 and two squares 50 is expanded outward from the segment 46. The squares 50 and the rectangle 48 of the rule-checking rectangle 52 are then verified to be whether overlapping any adjacent layout pattern, and if an overlapping is confirmed, the overlapped portion of the layout pattern is assigned as the minimum space violation region. In this embodiment, the bottom square 50 is overlapping a portion of the adjacent layout pattern 32, hence the portion of the layout pattern 32 overlapped by the square 50 is assigned as a minimum space violation region 54. The minimum space violation region 54 of the layout pattern 32 is removed thereafter and a corrected pattern 32 is output to complete the outward correction process.

Despite the embodiment illustrated in FIG. 2 involves an outward correction from the layout pattern 32 to the layout pattern 42 and another outward correction from the layout pattern 42 to the layout pattern 32, the single outward correction performed from the layout pattern 32 to the layout pattern 42 should already satisfy the minimum space defined by the mask rule check specification. In other words, as the segment 46 used by the layout pattern 42 for performing the aforementioned outward correction is the segment 46 of the preliminary layout pattern 42, if another outward correction is conducted from the layout pattern 42 to the layout pattern 32 after the outward correction performed by the layout pattern 32 to the layout pattern 42, the corrected layout pattern would be substantially smaller than the space defined by the mask rule specification. Therefore, the parameters of the mask rule correction specification could be adjusted before the correction to determine whether a single or multiple corrections is to be conducted.

Figure 3:
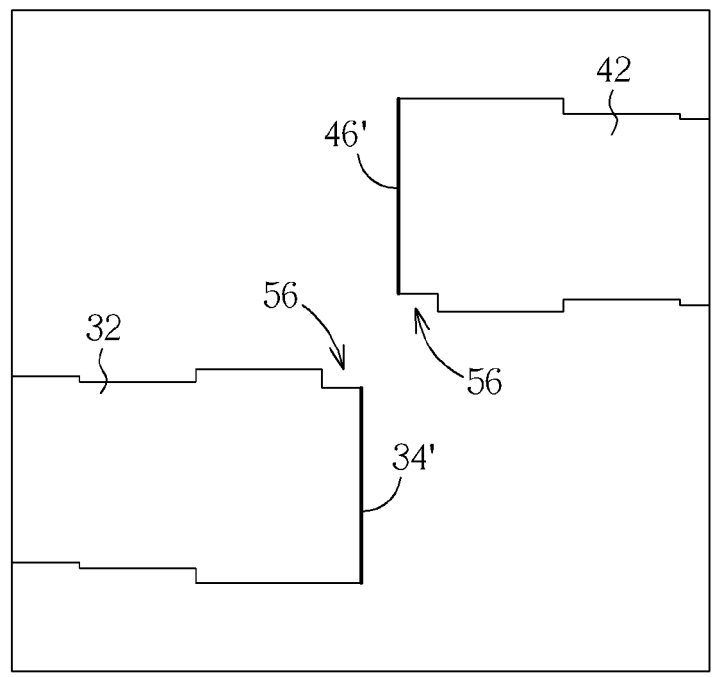
FIG. 3 illustrates a perspective view of the layout pattern obtained after an outward correction.

Referring to FIG. 3, FIG. 3 illustrates a perspective view of the layout pattern obtained after an outward correction. As shown in FIG. 3, the corrected layout pattern 32/42 is composed of primarily of a polygon pattern, in which each polygon pattern includes a segment 34'/46' utilized for generating a rule-checking rectangle. As the layout pattern 32/42 of this embodiment is corrected through an outward correction, a substantially rectangular notch 56 is preferably formed in the corrected layout pattern 32/42 corresponding to the location of the minimum space violation region 54/44 removed previously in FIG. 2. In this embodiment, at least one side of the notch is less than the length of the segment 34'46', and the length of the segment 34'/46' is preferably between 60 nm to 70 nm, but not limited thereto. In the outward correction of this embodiment, a correction is preferably made from each layout pattern to other adjacent layout patterns according to a mask rule correction specification.

Figure 4:
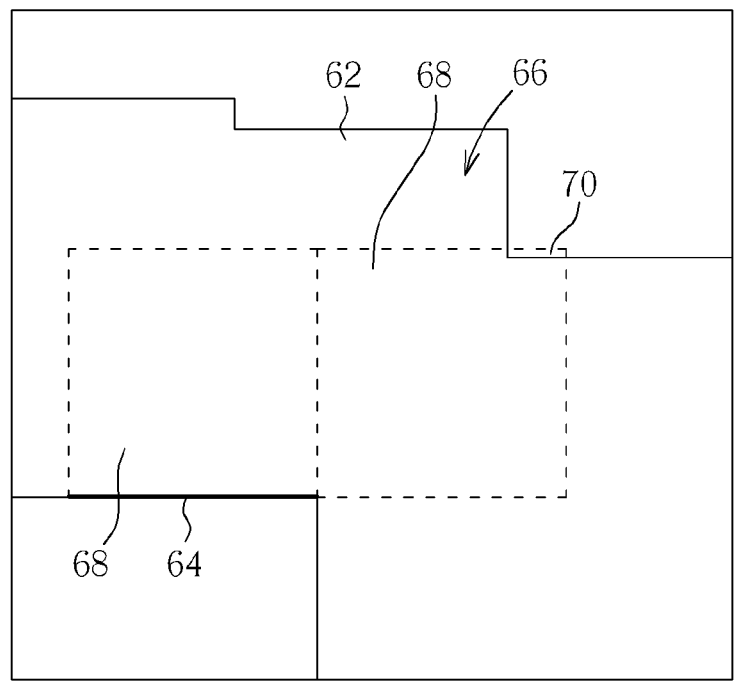
FIG. 4 illustrates a method of performing an inward correction according to a preferred embodiment of the present invention.

Referring to FIG. 4, FIG. 4 illustrates a method of performing an inward correction according to a preferred embodiment of the present invention. First, a layout pattern 62 is input in a computer system, in which the layout pattern 62 is preferably a pattern that has been processed through Boolean pre-treatment in the optical proximity correction stage. For sake of brevity, only a portion of the layout pattern 62 is shown in the FIG. 4.

A segment 64 is then selected from the layout pattern 62, and a rule-checking rectangle 66 containing at least a square is expanded inward from the segment 64. In this embodiment, the segment 64 is preferably an in-corner portion of the layout pattern 62 or a substantially narrower portion of the pattern 62, and the rule-checking rectangle 66 is preferably composed of two squares 68. The length of the segment 64, such as the length of each side of the square 68 is assigned as a minimum width according to a mask rule check specification.

Next, a verification is conducted to determine whether any region is covered by the square 68 that does not belong to the layout pattern 62 while the layout pattern 62 is overlapped by the square 68 of the rule-checking rectangle 66. In other words, any region exceeded by the square 68 as the square 68 overlaps the layout pattern 62 is inspected. In the layout pattern 62 of this embodiment, despite the major portion of the square 68 and the layout pattern 62 overlap each other, a small region located on the top right corner of the rule-checking rectangle 66 not belonging to the layout pattern 62 is overlapped by the square 68. As this region covered by the square 68 surpasses the minimum width defined by the mask rule correction specification, this region is assigned as a minimum width violation region 70. In order to satisfy the width specification defined, the minimum width violation generated during inward correction must be reinstated before forming a desirable layout pattern. Next, the minimum width violation region 70 is preferably reinstated to complete the inward correction process and the corrected layout pattern is output thereafter.

Figure 5:
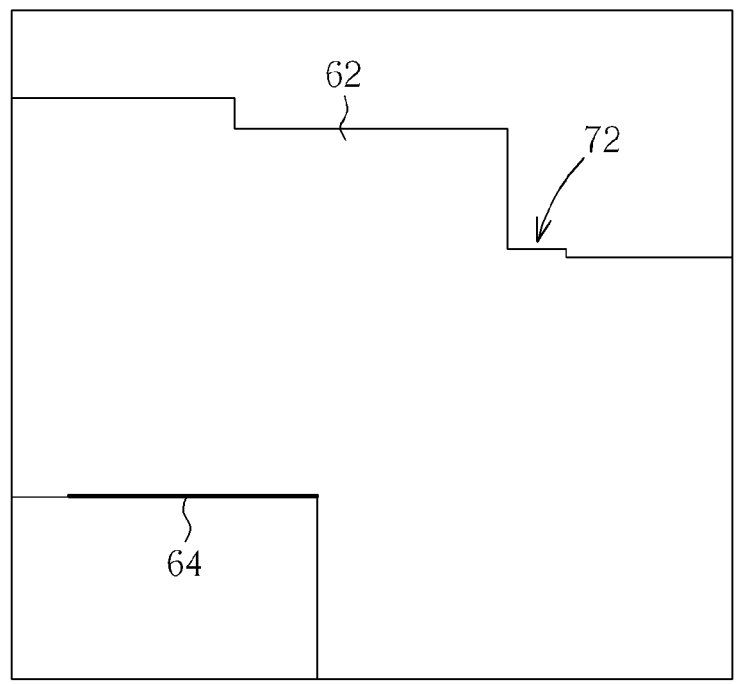
FIG. 5 illustrates a perspective view of the layout pattern obtained after an inward correction.

Referring to FIG. 5, FIG. 5 illustrates a perspective view of the layout pattern obtained after an inward correction. As shown in FIG. 5, the corrected layout pattern 62 is composed of a polygon pattern, in which the polygon pattern includes a segment 64 used for generating a rule-checking rectangle. As the layout pattern 62 of this embodiment is corrected through an inward correction, a block 72 protruding from the preliminary layout pattern 62 corresponding to the position of the aforementioned minimum width violation region is observed. The block 72 is preferably rectangular, but not limited thereto. In this embodiment, at least one side of the block 72 is less than the length of the segment 64, and the length of the segment 34'/46' is preferably between 60 nm to 70 nm, but not limited thereto. In the inward correction of this embodiment, a corner of the layout pattern is preferably selected to perform a corresponding correction to another corner of the same layout pattern. For instance, as revealed in FIGS. 4-5, an inward correction is conducted from the in-corner segment 64 of the layout pattern 62. Similarly, a corresponding inward correction could be done from the out corner segment (adjacent to the block 72) of the layout pattern 62 to the in-corner region, which is also within the scope of the present invention.

It should be noted even though outward correction and inward correction are discussed separately in the aforementioned embodiments, in actual practice the order and types of correction could be adjusted according to the property of the layout pattern. For instance, the present invention could conduct only the outward correction, only the inward correction, or conduct both corrections sequentially, such as performing an outward correction and then an inward correction, or performing an inward correction and then an outward correction. If only an outward correction is conducted, the final corrected layout pattern ready for output would equal to the preliminary layout pattern (one being processed through Boolean pre-treatment of OPC stage) minus the minimum space violation region; if only an inward correction is conducted, the corrected layout pattern ready for output would equal to the sum of the preliminary layout pattern (one being processed through Boolean pre-treatment of OPC stage) and the minimum width violation region; and if both corrections are conducted, the final corrected layout pattern would equal to the preliminary layout pattern minus the minimum space violation region and plus the minimum width violation region. According to another embodiment of the present invention, a reverse tone step could be carried out before the correction is conducted. For instance, if the preliminary layout pattern is a dark tone pattern, a reverse tone step preferably changes the dark tone pattern to a clear tone pattern while the surrounding clear tone pattern region is changed to dark tone pattern, thereby increasing the flexibility of the process.

Overall, the present invention provides a method for correcting layout pattern with no blind spot. According to a preferred embodiment of the present invention, a segment is selected from a layout pattern that has been processed through optical proximity correction, and a rule-checking rectangle containing at least one square is expanded from the segment for conducting an inward correction or an outward correction. In the outward correction, the other layout pattern overlapped by the square of the rule-checking rectangle is assigned as a minimum space violation region. The minimum space violation region is preferably removed to satisfy the space defined by the mask rule correction specification. In an inward correction, the region covered by the square of the rule-checking rectangle and surpassing the preliminary layout pattern is assigned as a minimum width violation region. The minimum width violation region is reinstated to satisfy the width defined by the mask rule correction specification. The corrected layout patterns are output thereafter and the corrected layout pattern is equal to the preliminary layout pattern minus the aforementioned minimum space violation region and plus the minimum width violation. By following this approach, a no blind spot correction could be carried out to output much more precise layout pattern to a mask than the conventional 45 degree approach.

Those skilled in the art will readily observe that numerous modifications and alterations of the device and method may be made while retaining the teachings of the invention.

What is claimed is:

1. A method for correcting layout pattern, comprising:
providing a layout pattern having at least one segment;
inputting the layout pattern into a computer system;
forming a rule-checking rectangle from the segment, wherein the rule-checking rectangle comprises a rectangle and two squares, and the length of the rectangle is equal to the length of the segment;
verifying whether one of the squares of the rule-checking rectangle overlaps other layout pattern;
removing the portion of other layout pattern overlapped by the one of the squares to obtain a corrected layout pattern; and
outputting the corrected layout pattern to a mask.

2. The method of claim 1, wherein one side of one of the squares is a minimum space defined by a mask rule check (MRC) specification.

3. The method of claim 1, further comprising assigning the portion of other layout pattern overlapped by one of the squares as a minimum space violation region.

4. The method of claim 3, wherein the step of removing the portion of other layout pattern overlapped by one of the squares comprises removing the minimum space violation region.

5. The method of claim 1, further comprising performing a reverse tone step before forming the rule-checking rectangle.

* * * * *